United States Patent
Wang et al.

(10) Patent No.: US 11,233,196 B2
(45) Date of Patent: Jan. 25, 2022

(54) MEMORY DEVICE STRUCTURE INCLUDING TILTED SIDEWALL AND METHOD FOR FABRICATING THE SAME

(71) Applicant: United Microelectronics Corp., Hsinchu (TW)

(72) Inventors: Wen-Jen Wang, Tainan (TW); Chun-Hung Cheng, Kaohsiung (TW); Chuan-Fu Wang, Miaoli County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/687,297

(22) Filed: Nov. 18, 2019

(65) Prior Publication Data
US 2021/0119124 A1    Apr. 22, 2021

(30) Foreign Application Priority Data
Oct. 21, 2019   (CN) .......................... 201910999208.1

(51) Int. Cl.
*H01L 45/00*    (2006.01)
(52) U.S. Cl.
CPC ........ *H01L 45/1253* (2013.01); *H01L 45/124* (2013.01); *H01L 45/1675* (2013.01); *G11C 2213/50* (2013.01); *G11C 2213/51* (2013.01); *G11C 2213/52* (2013.01)
(58) Field of Classification Search
None
See application file for complete search history.

(56) References Cited

U.S. PATENT DOCUMENTS

| | | | |
|---|---|---|---|
| 8,153,488 B2 | 4/2012 | Nishitani et al. | |
| 8,952,350 B2 | 2/2015 | Murase et al. | |
| 9,214,628 B2 | 12/2015 | Himeno et al. | |
| 2003/0067800 A1* | 4/2003 | Koganei | G11C 11/15 365/158 |
| 2007/0096248 A1* | 5/2007 | Philipp | H01L 45/06 257/528 |
| 2007/0138595 A1* | 6/2007 | Hsu | H01L 45/1675 257/536 |
| 2008/0273378 A1* | 11/2008 | Philipp | H01L 45/12 365/163 |
| 2009/0154227 A1* | 6/2009 | Philipp | G11C 13/0023 365/163 |
| 2013/0032775 A1 | 2/2013 | Satoh et al. | |
| 2016/0268505 A1 | 9/2016 | Sung et al. | |
| 2017/0062031 A1 | 3/2017 | Han | |
| 2019/0165258 A1 | 5/2019 | Peng et al. | |

OTHER PUBLICATIONS

"Search Report of Europe Counterpart Application", dated Sep. 22, 2020, p. 1-p. 6.
"Search Report of Europe Counterpart Application", dated Jun. 15, 2021, p. 1-p. 5.

* cited by examiner

Primary Examiner — J. H. Hur
(74) Attorney, Agent, or Firm — J.C. Patents

(57) ABSTRACT

A memory device structure includes a substrate, a memory stacked structure, and a spacer. The memory stacked structure is formed on the substrate by stacking a first electrode layer, a memory material layer, and a second electrode layer. The memory material layer has a tilted sidewall, or the memory material layer and the first electrode layer have a tilted sidewall. The tilted sidewall is indented with respect to a sidewall of the second electrode layer. The spacer is disposed on the tilted sidewall.

18 Claims, 8 Drawing Sheets

MEMORY DEVICE STRUCTURE INCLUDING TILTED SIDEWALL AND METHOD FOR FABRICATING THE SAME

CROSS-REFERENCE TO RELATED APPLICATION

This application claims the priority benefit of China patent application serial no. 201910999208.1, filed on Oct. 21, 2019. The entirety of the above-mentioned patent application is hereby incorporated by reference herein and made a part of this specification.

TECHNICAL FIELD

The disclosure relates to a semiconductor fabricating technology, and more particularly, to a memory device structure and a method for fabricating the same.

DESCRIPTION OF RELATED ART

A memory device is required for performing the overall functions of a digital electronic apparatus and configured to provide input data or to store output data during operation of the digital electronic apparatus. As the functionality of the digital electronic apparatus increases, the amount of data processed by the digital electronic apparatus also increase significantly. The memory device has thus inevitably been developed to comply with the trend toward the large memory capacity.

To increase the memory capacity, the direct way is to reduce the size of the memory cells and stack them in a height direction within a limited device area. So far various structures of the memory cells have been proposed, and the stacked structure is also included. In the basic stacked structure of the memory cell, a memory material layer is sandwiched between an upper electrode layer and a lower electrode layer. The memory cell having the stacked structure and memory material layers are in different states in response to different operation voltages and can store digital data according to different states. As to fabrication, the stacked structure can have the reduced device area, and there can be a plurality of memory layers in height in the stacked structure. As such, the memory capacity can be greatly improved.

The memory cell of the reduced size directly increases the memory capacity. On the other hand, due to the size reduction, the operation time of data writing or reading can also be shortened, thereby increasing the operation speed.

Given that data can be correctly written into or read from the memory cell, the effective operation area of the memory cell of the stacked structure is also expected to be reduced as much as possible, so as to improve the operation speed.

SUMMARY

The disclosure provides a memory device structure and a method for fabricating the same; for instance, given that an area occupied by the memory device structure stays small, an effective operation area can be further reduced, and an operation speed can be raised.

In an embodiment of the disclosure, a memory device structure including a substrate is provided. The memory stacked structure is formed on the substrate by stacking a first electrode layer, a memory material layer, and a second electrode layer. The memory material layer has a tilted sidewall, or the memory material layer and the first electrode layer have a tilted sidewall, and the tilted sidewall is indented with respect to a sidewall of the second electrode layer. A spacer is disposed on the tilted sidewall.

According to an embodiment of the disclosure, the tilted sidewall has a tilted angle with respect to a vertical direction of the substrate, and the tilted angle is at least 30 degrees.

According to an embodiment of the disclosure, the memory stacked structure having the memory material layer where the spacer is disposed has a flat stacked sidewall.

According to an embodiment of the disclosure, the memory stacked structure having the memory material layer and the first electrode layer where the spacer is disposed has a flat stacked sidewall.

According to an embodiment of the disclosure, the memory device structure further includes an insulation layer located on the tiled sidewall of the memory stacked structure and bonded to the spacer.

According to an embodiment of the disclosure, a size of an upper surface of the memory material layer is smaller than a size of a bottom surface of the second electrode layer.

According to an embodiment of the disclosure, the memory material layer includes a resistive memory material.

According to an embodiment of the disclosure, the memory material layer includes a buffer layer and a resistive layer stacked between the first electrode layer and the second electrode layer.

According to an embodiment of the disclosure, the second electrode layer includes a noble metal layer and a TaN layer.

According to an embodiment of the disclosure, the memory material layer includes a phase change memory material.

In an embodiment of the disclosure, a method for fabricating a memory device is provided, and the method includes providing a substrate. A memory stacked structure is formed on the substrate by stacking a first electrode layer, a memory material layer, and a second electrode layer. The memory material layer has a tilted sidewall, or the memory material layer and the first electrode layer have a tilted sidewall, and the tilted sidewall is indented with respect to a sidewall of the second electrode layer. A spacer is formed on the tilted sidewall.

According to an embodiment of the disclosure, the tilted sidewall has a tilted angle with respect to a vertical direction of the substrate, and the tilted angle is at least 30 degrees.

According to an embodiment of the disclosure, the step of forming the memory stacked structure and the spacer includes forming the first electrode layer on the substrate; forming the memory material layer on the first electrode layer, performing a tilting and patterning process on the memory material layer to form the tilted sidewall; depositing a dielectric layer on the first electrode layer, where the dielectric layer covers the memory material layer; polishing the dielectric layer to expose the memory material layer; forming the second electrode layer on the memory material layer and a remaining portion of the dielectric layer; patterning the second electrode layer, the dielectric layer, and the first electrode layer, wherein the remaining portion of the dielectric layer becomes the spacer disposed on the tilted sidewall of the memory material layer.

According to an embodiment of the disclosure, the step of forming the memory stacked structure and the spacer includes forming the first electrode layer on the substrate, forming the memory material layer on the first electrode layer, performing a tilting and patterning process on the memory material layer and the first electrode layer to form the tilted sidewall, depositing a dielectric layer on the substrate, wherein the dielectric layer covers the memory material layer and the first electrode layer, polishing the dielectric layer to expose the memory material layer, forming the second electrode layer on the memory material layer and a remaining portion of the dielectric layer, and patterning the second electrode layer and the dielectric layer, wherein the remaining portion of the dielectric layer becomes the spacer on the tilted sidewall of the memory material layer.

According to an embodiment of the disclosure, the method further includes forming an insulation layer on the tiled sidewall of the memory stacked structure, and the insulation layer is bonded to the spacer.

According to an embodiment of the disclosure, a size of an upper surface of the memory material layer is smaller than a size of a bottom surface of the second electrode layer.

According to an embodiment of the disclosure, the memory material layer includes a resistive memory material.

According to an embodiment of the disclosure, the step of forming the memory material layer includes forming a buffer layer on the first electrode layer and forming a resistive layer on the buffer layer and below the second electrode layer.

According to an embodiment of the disclosure, the step of forming the second electrode layer includes stacking a noble metal layer and a TaN layer.

According to an embodiment of the disclosure, the memory material layer includes a phase change memory material.

In order to make the aforementioned advantages of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

The disclosure relates to a memory device structure and a method for fabricating the same. In terms of fabrication, it is possible to maintain a device area that is likely to be reduced; given the reduced device area, the effective operation area may be further reduced, so as to at least increase the operation speed.

Figure 1:
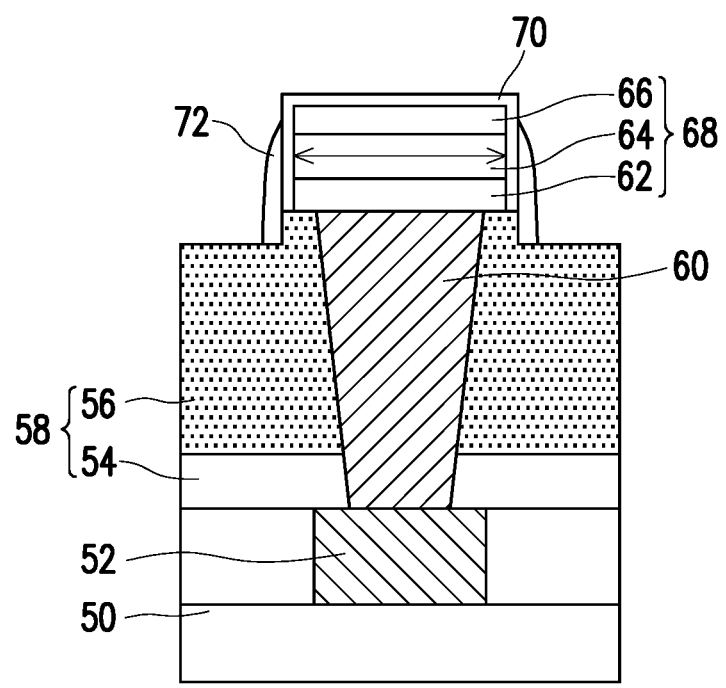
FIG. 1 is a schematic cross-sectional view of a memory cell having a stacked structure according to an embodiment of the disclosure.

FIG. 1 is a schematic cross-sectional view of a memory cell having a stacked structure according to an embodiment of the disclosure. With reference to FIG. 1, generally, some control devices and an interconnect structure 52 may be formed on a silicon substrate 50, which will not be described in detail hereinafter. An inter-layer dielectric layer 58 is applied to form a conductive plug 60 for connecting the interconnect structure 52 to a memory cell 68. The inter-layer dielectric layer 58 complies with the requirements for fabricating multi-layer circuits, e.g., the inter-layer dielectric layer 58 may have dielectric material layers 54 and 56 stacked together.

A stacked structure of the memory cell 68 includes a memory material layer 64 sandwiched by an upper electrode layer 66 and a lower electrode layer 62 for form a sandwich-like stacked structure. An insulation layer 70 and a spacer 72 are also formed on the outside of the stacked structure.

Through looking into the stacked structure of the memory cell 68 shown in FIG. 1, it can be observed that a contact area of the memory material layer 64 and the upper electrode layer 66, as indicated by the double-headed arrow, constitutes an effective operation area of the memory cell 68. The smaller the area is, the shorter time of completely writing data into or reading data from the memory cell 68 is. That is, if the effective operation area of the memory cell 68 can be reduced, the operation speed can be increased, given that the memory cell 68 has a predetermined size.

In the disclosure, the stacked structure of the memory cell 68 shown in FIG. 1 is provided, and through modifications of the fabricating process, a structure of the memory cell 68 with the reduced effective operation area can be obtained.

Some embodiments are described below, but the disclosure is not limited to the embodiments. In addition, various features described in the embodiment may be properly combined.

Figure 2A:
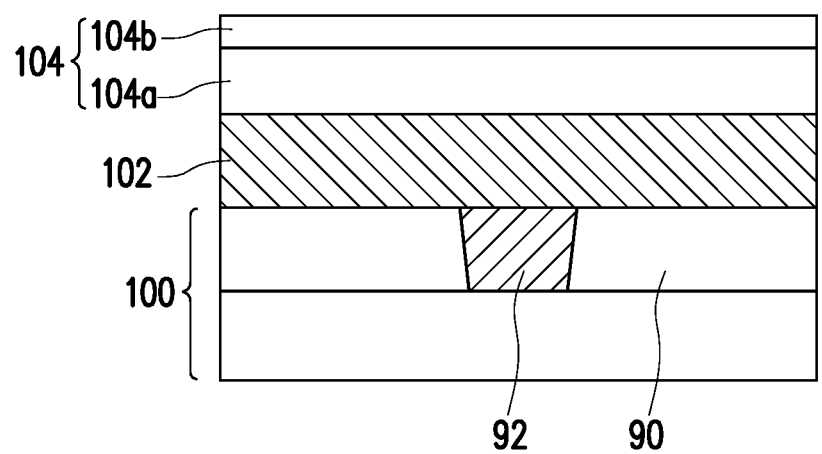
FIG. 2A to FIG. 2G are schematic cross-sectional views of a process for fabricating a memory cell having a stacked structure according to an embodiment of the disclosure.

FIG. 2A to FIG. 2G are schematic cross-sectional views of a process for fabricating a memory cell having a stacked structure according to an embodiment of the disclosure. With reference to FIG. 2A, a substrate 100 already includes the components formed in the previous stage, such as a conductive plug 92 that is formed in a corresponding inter-layer dielectric layer 90 and is intended to be connected to the stacked structure of the memory cell. That is, in an embodiment, the desired structure has been partially completed in the substrate 100, and the completed portion in the substrate 100 is not limited in the disclosure.

An initial lower electrode layer 102 and a memory material layer 104 are formed on the substrate 100. In an embodiment, the lower electrode layer 102 is, for instance, TaN, but the disclosure is not limited thereto. The memory material layer 104 is exemplified by a resistive (Re) memory material, which is, for instance, a buffer layer 104a and a resistive layer 104b. The resistive layer 104b is, for instance, a transition metal oxide layer or a resistive layer of Ta2O5. The material of the buffer layer 104a and the resistive layer 104b is not limited in the disclosure.

Figure 2B:
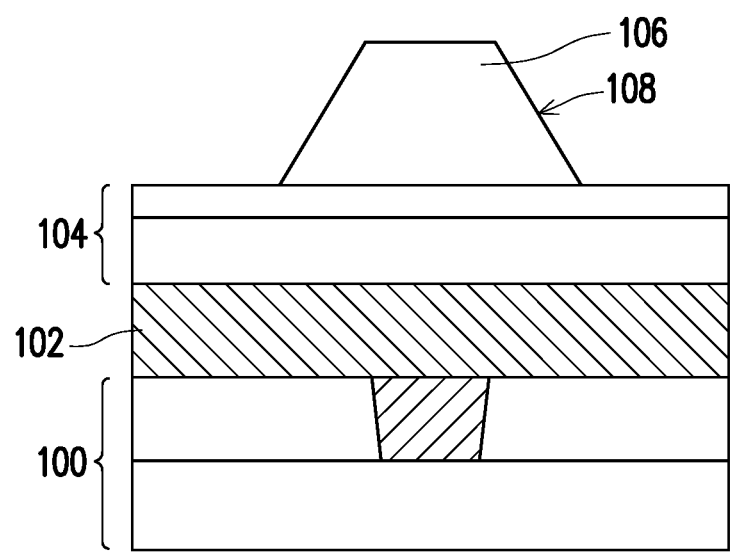

With reference to FIG. 2B, according to embodiment of the disclosure, a tilting and patterning process is performed to pattern the memory material layer 104. A photoresist layer 106 is formed on the memory material layer 104. A sidewall 108 of the photoresist layer 106 has a tilted angle, which can be predetermined through controlling conditions of the lithography.

Figure 2C:
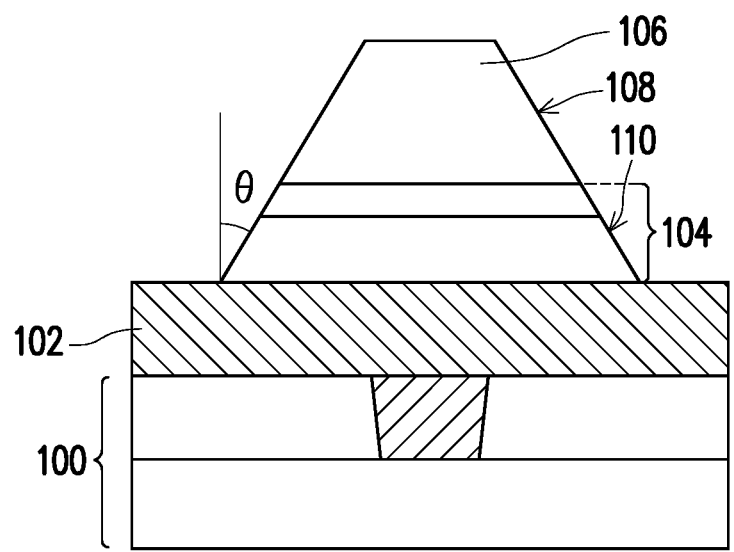

With reference to FIG. 2C, since the sidewall 108 of the photoresist layer 106 has a predetermined tilted angle and serves as an etching mask in an etching process, the memory material layer 104 is patterned, and a sidewall 110 of the memory material layer 104 also has a tilted angle θ due to the tilted angle of the sidewall 108 of the photoresist layer 106. The tilted angle θ is an included angle between the sidewall 110 of the memory material layer 104 and a direction perpendicular to the substrate 100. The tilted angle θ is at least 30 degrees, and it may reach 70 degrees according to actual requirements. The maximum range of the tilted angle θ, as permitted by the manufacturing process, is determined by the manufacturing process according to an embodiment of the disclosure.

Figure 2D:
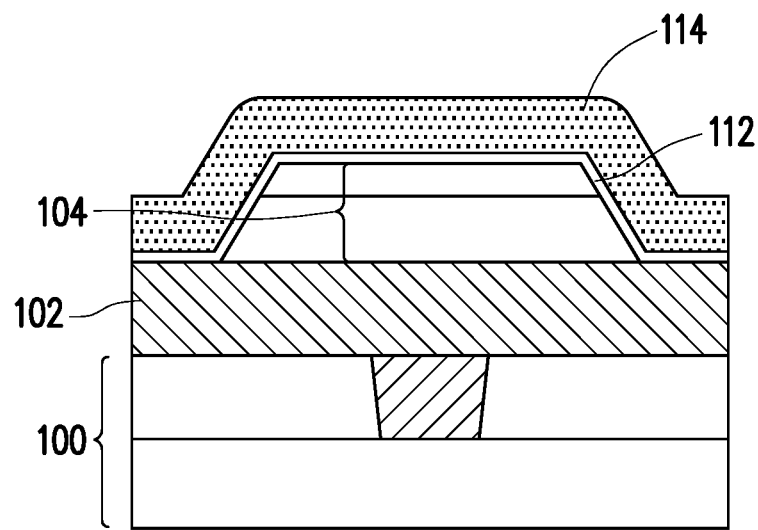

With reference to FIG. 2D, after the photoresist layer 106 is removed, the sidewall 110 of the memory material layer 104 is a tilted sidewall. In an embodiment, a thin insulation layer 112, such as an oxide layer, covers the lower electrode layer 102 and the memory material layer 104. A protective dielectric layer 114 is also formed on the insulation layer 112. The dielectric layer 114 and the insulation layer 112 may provide insulation and protection after the fabrication is completed.

Figure 2E:
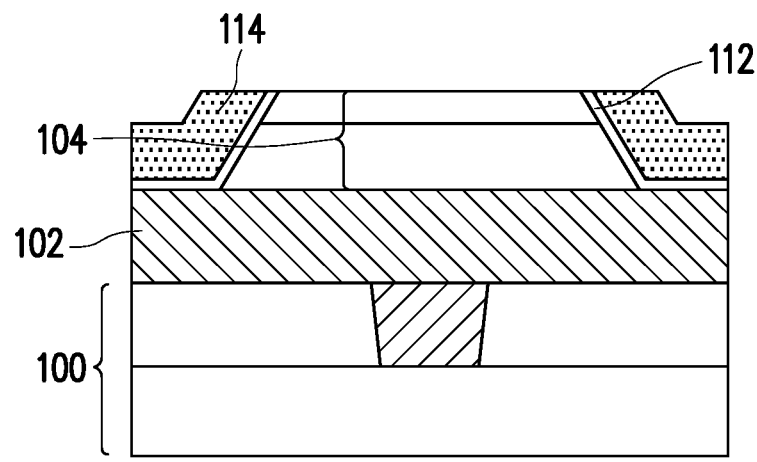

With reference to FIG. 2E, a polishing process is performed to polish the dielectric layer 114 and the insulation layer 112 to expose the memory material layer 104.

Figure 2F:
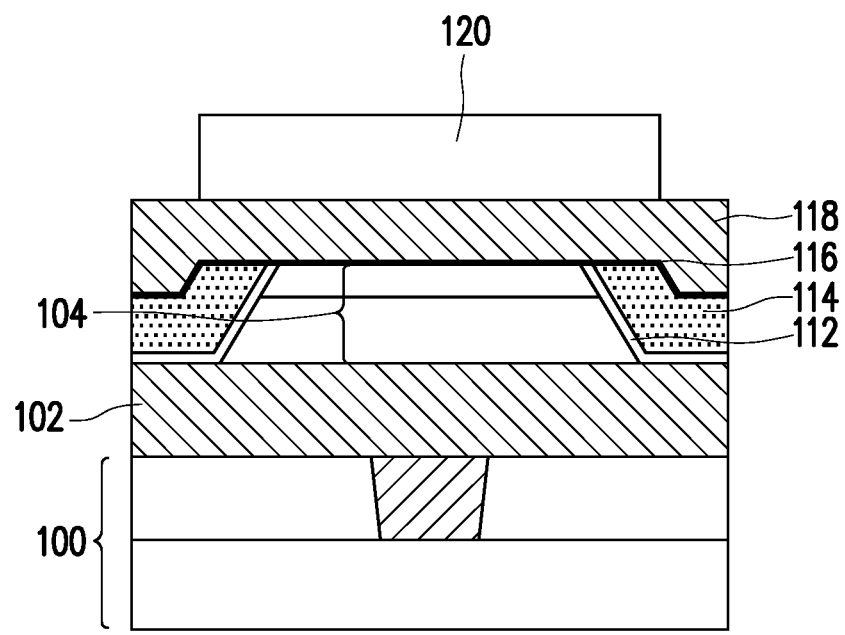

With reference to FIG. 2F, in an embodiment, according to the requirements of the memory material layer 104, a thin layer serving as a barrier layer 116 and capable of functioning as a barrier, such as a noble metal layer, e.g., an Ir layer, may be formed. However, the disclosure is not limited to the embodiments provided herein. In other words, the memory material layer 104 provided in an embodiment of the disclosure may further include the barrier layer 116, which should however not be construed as a limitation in the disclosure. In an embodiment, the memory material layer 104 may also be a phase change memory material, and the stacked layer structure of the memory material layer 104 is not limited in the disclosure.

Thereafter, an upper electrode layer 118 is formed on a remaining portion of the dielectric layer 114 and the insulation layer 112 and the memory material layer 104. The material of the upper electrode layer 118 is, for instance, the same as the material of the lower electrode layer 102, which is also, for instance, TaN, but the disclosure is not limited thereto.

Thereafter, a photoresist layer 120 is formed on the upper electrode layer 118. A size of the photoresist layer 120 is a predetermined size of the memory cell. The photoresist layer 120 acting as an etching mask is applied to perform an anisotropic etching process, so as to remove a portion of the upper electrode layer 118, the barrier layer 116, the dielectric layer 114, the insulation layer 112, and the lower electrode layer 102. A portion of the substrate 100 is thus exposed as well. The memory material layer 104 is within the coverage of the photoresist layer 120 and is thus not etched.

In an embodiment, the outer shape of the photoresist layer 120 coincides with the bottom periphery of the memory material layer 104; hence, the memory material layer 104 is not etched, and the memory material layer 104 can still perform the insulation function. In an embodiment, the size of the photoresist layer 120 may also be slightly larger than the size of the bottom periphery of the memory material layer 104.

Figure 2G:
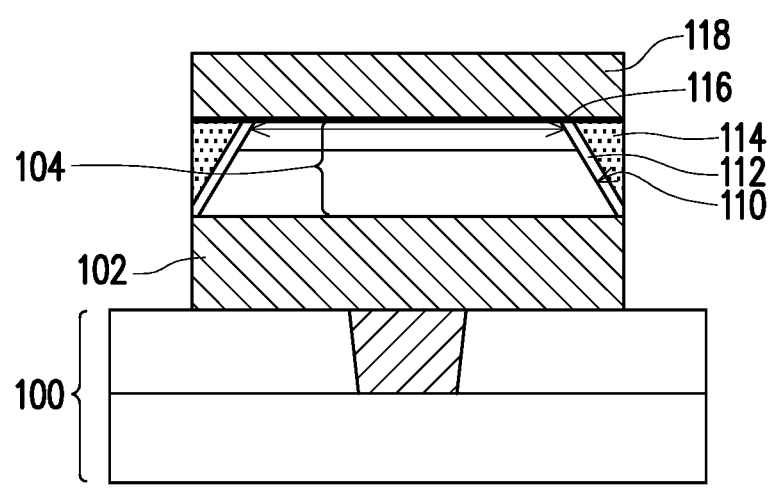

With reference to FIG. 2G, the photoresist layer 120 acting the etching mask is applied to perform the anisotropic etching process, so as to remove a portion of the upper electrode layer 118, the barrier layer 116, the dielectric layer 114, the insulation layer 112, and the lower electrode layer 102; as such, the stacked structure of the memory cell can be obtained.

In such a structure, the contact area of the memory material layer 104 and the upper electrode layer 118 can be substantially reduced as indicated by the double-headed arrow, thus reducing the effective operation area, and the reduction of the effective operation area may increase the operation speed.

According to the same technical concept, the disclosure is not limited to the foregoing embodiments. Some other embodiments are provided below. FIG. 3A to FIG. 3F are schematic cross-sectional views of a process for fabricating a memory cell having a stacked structure according to an embodiment of the disclosure.

Figure 3A:
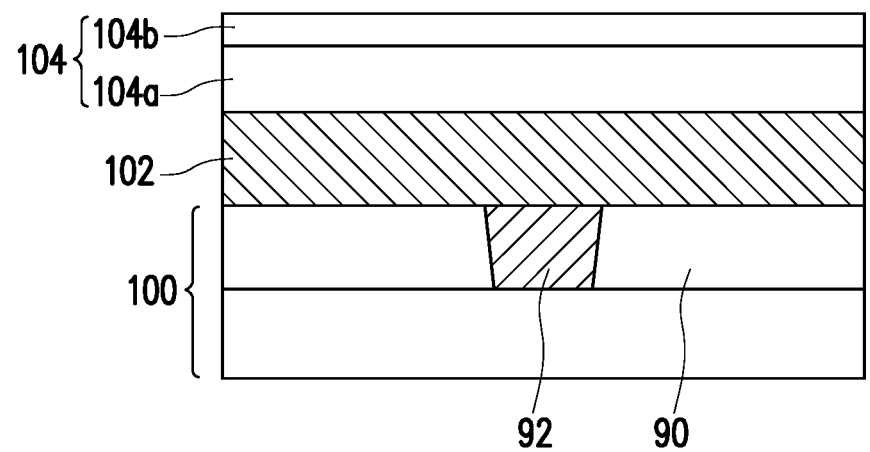
FIG. 3A to FIG. 3F are schematic cross-sectional structural views of a process for fabricating a memory cell having a stacked structure according to an embodiment of the disclosure.
Figure 3B:
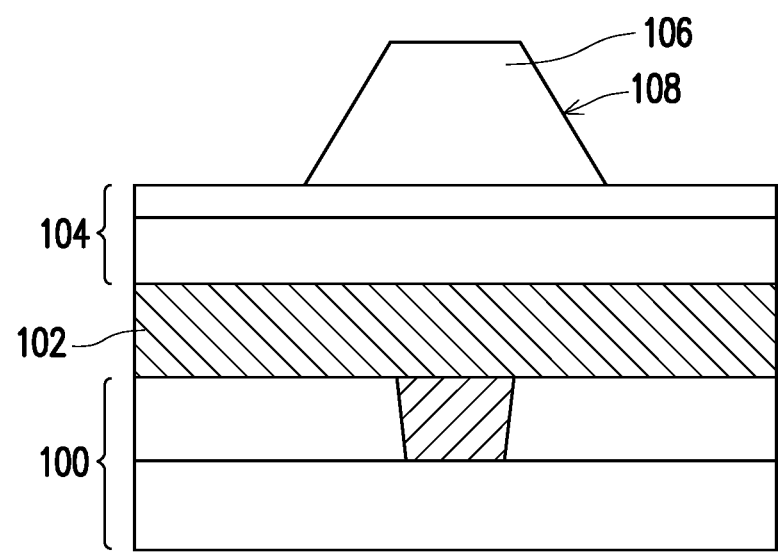

With reference to FIG. 3A, similar to FIG. 2A, the initial lower electrode layer 102 and the memory material layer 104 are formed on the substrate 100. With reference to FIG. 3B, similar to FIG. 2B, there is the photoresist layer 106 having the tilted sidewall 108.

Figure 3C:
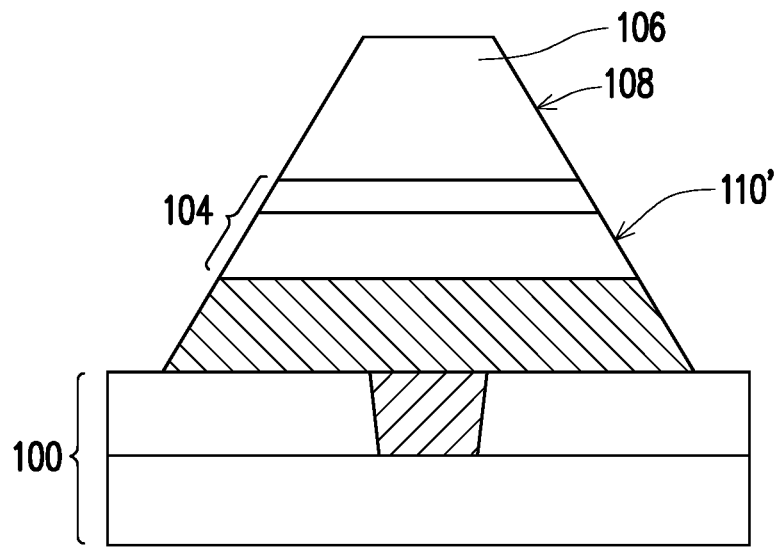

With reference to FIG. 3C, in an embodiment, the photoresist layer 106 acting as the etching mask is applied to perform an etching process on the memory material layer 104 and the lower electrode layer 102. Since the sidewall 108 of the photoresist layer 106 has a predetermined tilted angle and acts as the etching mask during the etching process, the memory material layer 104 and the lower electrode layer 102 are patterned, and due to the tilted angle of the sidewall 108 of the photoresist layer 106, a sidewall 110' of the memory material layer 104 and the lower electrode layer 102 also has a tilted angle, which is an included angle between the sidewall 110' and a direction perpendicular to the substrate 100 and is at least 30 degrees, as the tilted angle θ illustrated in FIG. 2C. Thus, no further explanation will be provided hereinafter. The etching process provided in this embodiment is also performed on the lower electrode layer 102 to expose the underlying substrate 100.

Figure 3D:
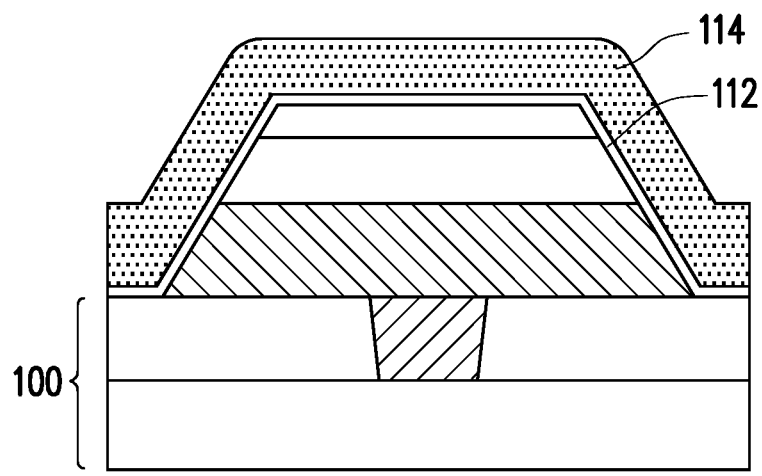

With reference to FIG. 3D, after the photoresist layer 106 is removed, the sidewall 110' of the memory material layer 104 and the lower electrode layer 102 is a tilted sidewall. In an embodiment, a thin insulation layer 112, such as an oxide layer, covers the substrate 100, the lower electrode layer 102, and the memory material layer 104. A protective dielectric layer 114 is also formed on the insulation layer 112. The dielectric layer 114 and the insulation layer 112 may provide insulation and protection after the fabrication is completed.

Figure 3E:
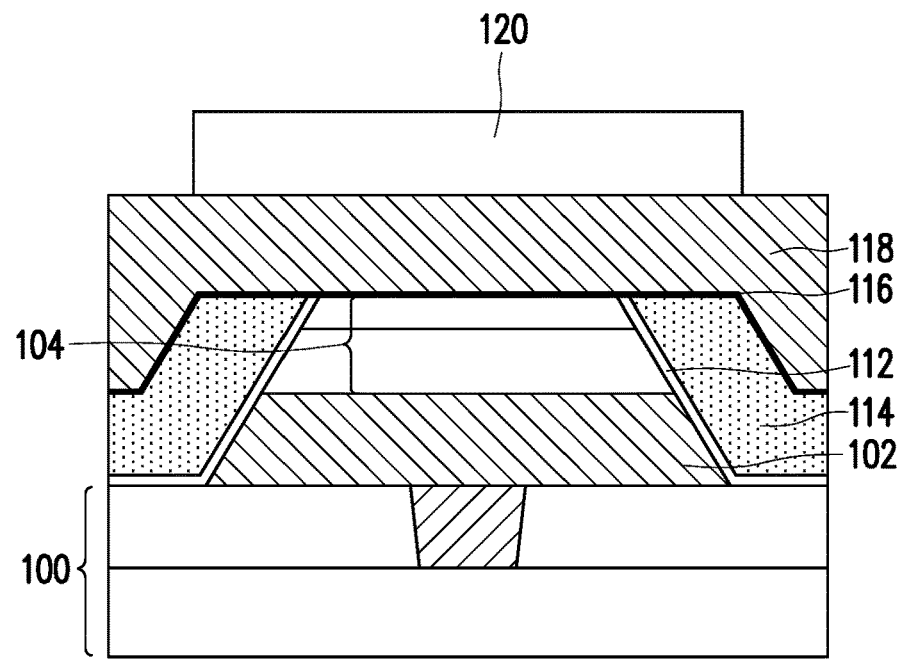

With reference to FIG. 3E, a polishing process is performed to polish the dielectric layer 114 and the insulation layer 112 to expose the memory material layer 104. According to the requirements of the memory material layer 104, as illustrated in FIG. 2F, a thin layer serving as a barrier layer 116 and capable of functioning as a barrier, such as a noble metal layer, may be formed. However, the disclosure is not limited to the embodiments provided herein. Thereafter, the upper electrode layer 118 is formed on the remaining portion of the dielectric layer 114 and the insulation layer 112 and the memory material layer 104. Further, as described above, the material of the upper electrode layer 118 is, for instance, the same as the material of the lower electrode layer 102, which is also, for instance, TaN, but the disclosure is not limited thereto.

The photoresist layer 120 is formed on the upper electrode layer 118. A size of the photoresist layer 120 is a predetermined size of the memory cell. In an embodiment, the photoresist layer 120 covers at least the sidewall 110' of the memory material layer 104 and the lower electrode layer 102. The photoresist layer 120 acting as an etching mask is applied to perform an anisotropic etching process, so as to remove a portion of the upper electrode layer 118, the barrier layer 116, the dielectric layer 114, and the insulation layer 112. A portion of the substrate 100 is thus exposed as well. The memory material layer 104 and the lower electrode layer 102 are within the coverage of the photoresist layer 120 and thus are not etched.

In an embodiment, the outer shape of the photoresist layer 120 coincides with the bottom periphery of the lower electrode layer 102; hence, the memory material layer 104 is not etched, and the memory material layer 104 can still perform the insulation function. In an embodiment, the size of the photoresist layer 120 may also be somewhat larger than the bottom periphery of the lower electrode layer 102.

Figure 3F:
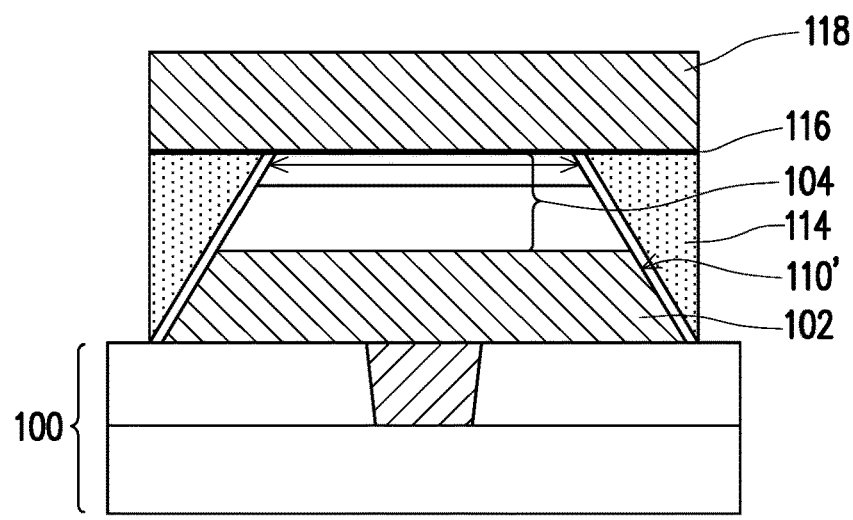

With reference to FIG. 3F, the photoresist layer 120 acting as the etching mask is applied to perform the anisotropic etching process, so as to remove the upper electrode layer 118, the barrier layer 116, the dielectric layer 114, and the insulation layer 112 are removed; as such, the stacked structure of the memory cell can be obtained. The area of the stacked structure remains at the predetermined size, but the upper surface of the memory material layer 104 is further decreased, so that the effective operation area can be further decreased. The reduction of the effective operation area may increase the operation speed.

As explained earlier, the sidewall of the memory material layer 104 has an indented structure. The upper surface area of the memory material layer 104 is thus reduced, and the effective operation area can be further decreased, thereby increasing the operation speed.

Although the disclosure has been disclosed in the above embodiments, it is not intended to limit the disclosure, and any one of ordinary skill in the art will be able to make some modifications and refinements without departing from the spirit and scope of the disclosure. The scope of the disclosure is defined by the scope of the appended claims.

What is claimed is:

1. A memory device structure comprising:
   a substrate;
   a memory stacked structure formed on the substrate by stacking a first electrode layer, a memory material layer, and a second electrode layer, wherein the memory material layer has a tilted sidewall, and the tilted sidewall is indented with respect to a sidewall of the second electrode layer;
   a spacer disposed on the tilted sidewall; and
   an insulation layer located between the memory material layer and the spacer,
   wherein the spacer and the insulation layer are located between the first electrode layer and the second electrode layer,
   wherein the memory material layer comprises a resistive memory material,
   wherein a sidewall surface of the second electrode layer is aligned in straight to a sidewall surface of the spacer,
   wherein the first electrode layer and the second electrode layer are substantially equal in width.

2. The memory device structure according to claim 1, wherein the tilted sidewall has a tilted angle with respect to a vertical direction of the substrate, and the tilted angle is at least 30 degrees.

3. The memory device structure according to claim 1, wherein the memory stacked structure having the memory material layer where the spacer is disposed has a flat stacked sidewall.

4. The memory device structure according to claim 1, wherein the memory stacked structure having the memory material layer and the first electrode layer where the spacer is disposed has a flat stacked sidewall.

5. The memory device structure according to claim 1, wherein the insulation layer is located on the tilted sidewall of the memory stacked structure and bonded to the spacer.

6. The memory device structure according to claim 1, wherein a size of an upper surface of the memory material layer is smaller than a size of a bottom surface of the second electrode layer.

7. The memory device structure according to claim 1 wherein the memory material layer comprises the resistive memory material of transition metal oxide.

8. The memory device structure according to claim 1, wherein the memory material layer comprises a buffer layer and a resistive layer stacked between the first electrode layer and the second electrode layer, and the buffer layer and the resistive layer are the resistive memory material.

9. The memory device structure according to claim 8, wherein the second electrode layer comprises a noble metal layer and a TaN layer.

10. A method for fabricating a memory device, the method comprising:
    providing a substrate;
    forming a memory stacked structure on the substrate, the memory stacked structure being formed by stacking a first electrode layer, a memory material layer, and a second electrode layer, wherein the memory material layer has a tilted sidewall, and the tilted sidewall is indented with respect to a sidewall of the second electrode layer;
    forming a spacer on the tilted sidewall; and
    forming an insulation layer between the memory material layer and the spacer,
    wherein the spacer and the insulation layer are located between the first electrode layer and the second electrode layer,
    wherein the memory material layer comprises a resistive memory material,
    wherein a sidewall surface of the second electrode layer is aligned in straight to a sidewall surface of the spacer,
    wherein the first electrode layer and the second electrode layer are substantially equal in width.

11. The method according to claim 10, wherein the tilted sidewall has a tilted angle with respect to a vertical direction of the substrate, and the tilted angle is at least 30 degrees.

12. The method according to claim 10, wherein the step of forming the memory stacked structure and the spacer comprises:
    forming the first electrode layer on the substrate;
    forming the memory material layer on the first electrode layer;
    performing a tilting and patterning process on the memory material layer to form the tilted sidewall;
    depositing a dielectric layer on the first electrode layer, the dielectric layer covering the memory material layer;
    polishing the dielectric layer to expose the memory material layer;
    forming the second electrode layer on the memory material layer and on a remaining portion of the dielectric layer; and
    patterning the second electrode layer, the dielectric layer, and the first electrode layer, wherein the remaining portion of the dielectric layer becomes the spacer disposed on the tilted sidewall of the memory material layer.

13. The method according to claim 10, wherein the step of forming the memory stacked structure and the spacer comprises:
    forming the first electrode layer on the substrate;
    forming the memory material layer on the first electrode layer;
    performing a tilting and patterning process on the memory material layer and the first electrode layer to form the tilted sidewall;

depositing a dielectric layer on the substrate, the dielectric layer covering the memory material layer and the first electrode layer;

polishing the dielectric layer to expose the memory material layer;

forming the second electrode layer on the memory material layer and on a remaining portion of the dielectric layer; and patterning the second electrode layer and the dielectric layer, wherein the remaining portion of the dielectric layer becomes the spacer disposed on the tilted sidewall of the memory material layer.

14. The method according to claim 10, wherein the insulation layer is located on the tilted sidewall of the memory stacked structure and bonded to the spacer.

15. The method according to claim 10, wherein a size of an upper surface of the memory material layer is smaller than a size of a bottom surface of the second electrode layer.

16. The method according to claim 10, wherein the memory material layer comprises the resistive memory material of transition metal oxide.

17. The method according to claim 10, wherein the step of forming the memory material layer comprises:

forming a buffer layer on the first electrode layer; and forming a resistive layer on the buffer layer, the resistive layer being located below the second electrode layer, wherein the buffer layer and the resistive layer are the resistive memory material.

18. The method according to claim 10, wherein the step of forming the second electrode layer comprises stacking a noble metal layer and a TaN layer.

* * * * *